(12) United States Patent
Joo

(10) Patent No.: US 7,081,418 B2
(45) Date of Patent: Jul. 25, 2006

(54) METHOD OF FABRICATING A MULTI-LAYERED THIN FILM BY USING PHOTOLYSIS CHEMICAL VAPOR DEPOSITION

(75) Inventor: Jae-Hyun Joo, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/150,403

(22) Filed: May 16, 2002

(65) Prior Publication Data
US 2002/0173124 A1    Nov. 21, 2002

(30) Foreign Application Priority Data
May 18, 2001  (KR) .............................. 2001-27347

(51) Int. Cl.
  *H01L 21/31*  (2006.01)
  *H01L 21/46*  (2006.01)
(52) U.S. Cl. ................ 438/761; 438/792; 257/E21.463
(58) Field of Classification Search ................ 118/722
  See application file for complete search history.

(56) References Cited

U.S. PATENT DOCUMENTS

| 4,933,300 | A | * | 6/1990 | Koinuma et al. ........... 438/485 |
| 5,213,654 | A | * | 5/1993 | Sasaki et al. ................ 156/614 |
| 5,240,583 | A | * | 8/1993 | Ahonen .................. 204/298.04 |
| 5,270,390 | A | * | 12/1993 | Shibuya et al. ............. 525/173 |
| 5,308,461 | A | * | 5/1994 | Ahonen .................. 204/192.11 |
| 5,525,199 | A | * | 6/1996 | Scobey .................. 204/192.26 |
| 5,851,365 | A | * | 12/1998 | Scobey .................. 204/192.12 |
| 6,586,346 | B1 | * | 7/2003 | Yamazaki et al. .......... 438/774 |

FOREIGN PATENT DOCUMENTS

| JP | 61276233 | * | 12/1986 |
| JP | 62-213116 | | 9/1987 |
| KR | 2000-15506 | | 3/2000 |
| KR | 2002069319 A | * | 8/2002 |

OTHER PUBLICATIONS

English language abstract for Japanese Patent Publication No. 62-213116.
English language abstract for Korean Patent Publication No. 2000-15506.

* cited by examiner

*Primary Examiner*—Alonzo Chambliss
(74) *Attorney, Agent, or Firm*—Marger Johnson & McCollom, P.C.

(57) ABSTRACT

A method of forming a multi-layered thin film uses photolysis chemical vapor deposition (PCVD). In the method, a substrate for a process of forming the multi-layered thin film is prepared. At least two source gases are supplied to the substrate. Reaction lights having particular wavelengths are prepared, which are absorbed by each of the source gases, are prepared. The reaction lights having particular wavelengths are alternatingly emitted on the substrate to a form a predetermined multi-layered thin film. A photolysis chemical vapor deposition (PCVD) reactor is disclosed, having a chamber with a substrate support, a gas supply system for supplying a plurality of source gases to the substrate in the chamber, and a light supply system mounted at one side of the chamber. The light supply system selectively emits one of the plurality of reaction lights having different wavelengths on the substrate.

20 Claims, 9 Drawing Sheets

Absorption ⟶ Photo-Dissociation ⟶ Reaction ⟶ Deposition

FIG. 3D

| LASER | WAVE LENGTH | TYPE |
|---|---|---|
| ArF EXCIMER | 193nm | PULSED, GAS DISCHARGE |
| KrF EXCIMER | 248nm | PULSED, GAS DISCHARGE |
| XeCl EXCIMER | 308nm | PULSED, GAS DISCHARGE |
| $Ar^+$ | 488, 514nm | CW, GAS DISCHARGE |
| $Ar^+$ (DOUBLE) | 257nm | CW, GAS DISCHARGE |
| Nd YAG (DOUBLE) | 530nm | PULSED, SOLID |
| $CO_2$ | 10.6μm | PULSED, GAS DISCHARGE |

METHOD OF FABRICATING A MULTI-LAYERED THIN FILM BY USING PHOTOLYSIS CHEMICAL VAPOR DEPOSITION

This application claims priority from Korean Patent Application No. 2001-002737, filed on May 18, 2001, the contents of which are incorporated herein by this reference in their entirety.

BACKGROUND OF THE INVENTION

1. The Field of the Invention

The present invention relates to a method for forming a multi-layered thin film and, more particularly, to a method and an apparatus for forming a multi-layered thin film using a photolysis chemical vapor deposition (PCVD) by which a thin film is deposited using light energy.

2. Description of the Related Art

A multi-layered thin film having a combination of different materials is widely used for photoelectron devices and magnetic cells as well as semiconductor devices because it has unique characteristics compared to a single layer thin film. In the semiconductor industry, a physical vapor deposition method and a chemical vapor deposition method are most widely used to form thin films. These methods are mostly used to form a single layer using one or two source gases. When forming a multi-layered thin film, various source gases can be alternatively supplied to form the multi-layered thin film. However, these methods suffer from drawbacks such as the lack of process stability or the difficulty in the configuration of various apparatuses.

Layer-by-layer deposition methods have been extensively studied as techniques for forming a multi-layered thin film. A single crystal compound having a desired composition and few defects may be formed by the layer-by-layer deposition techniques.

Molecular beam epitaxy (MBE) and cyclic CVD, which is an atomic layer deposition (ALD) method, or digital CVD are examples of such layer-by-layer deposition techniques. However, in the case of MBE, equipment is very expensive and productivity is low. Thus, the ALD method is getting the most attention among those layer-by-layer deposition methods.

In the ALD method, two different layers are sequentially stacked on a substrate by alternatingly supplying two different source gases into a deposition reactor, thereby forming a multi-layered thin film. Since this ALD method does not require a high vacuum state necessary for the above-described MBE, it has an advantage of increased deposition rate.

However, when a multi-layered thin film is formed by this conventional ALD method, a gas purge step using an inert gas is inevitably added between steps of forming each layer of the multi-layered thin film in order to remove an unwanted layer formed due to physical adsorption on a substrate.

Because of such additional purging steps in the conventional ALD, deposition efficiency is low and there have been difficulties in equipment maintenance because a purging valve has to be repeatedly opened and closed. Thus, the conventional ALD method has a limit in mass production.

SUMMARY OF THE INVENTION

The present invention provides a method for forming a multi-layered thin film using a PCVD method, which can improve deposition efficiency. The present invention also provides a PCVD reactor that can easily deposit a plurality of multi-layered thin films.

A substrate is prepared for formation of the multi-layered thin film thereon. An atmosphere comprising a mixture of a plurality of source gases is formed over the substrate. Each of a plurality of reaction lights having different wavelengths alternatingly illuminate the substrate and the plurality of source gases for a predetermined time.

Here, the plurality of source gases have different deposition objects and different light absorption wavelength ranges. Thus, it is preferable that a particular film may be formed for light having a particular wavelength. The plurality of source gases comprise $P(CH_3)_3$ (trimethyl phosphine) and $In(CH_3)_3$ (trimethyl indium).

The plurality of reaction lights having different wavelengths is absorbed into at least one of the plurality of source gases to excite the state of the source gases. One of the plurality of source gases reacts during the emission of one of the plurality of reaction lights to form one layer of the multi-layered thin film. Using light of different wavelengths, other members of the plurality of source gases can be similarly excited and react to form selected layers of the multi-layer film. For a particular targeted source gas, light of a selected wavelength does not substantially excite the other source gases in the plurality of source gases. Non-targeted source gases therefore do not react in that step to form a layer of the multi-layered thin film.

A light source of the plurality of reaction lights may be a laser-type condensing light. The plurality of reaction lights move in a parallel direction with respect to the surface of the substrate to scan the whole surface of the substrate.

An atmosphere at a low pressure, e.g. 0.1–700 Torr, may be formed before forming the atmosphere of a mixture of source gases so that light reaction is easily performed.

In another embodiment of a method of forming a multi-layered thin film according to the present invention, a substrate is prepared for formation of the multi-layered thin film thereon. An atmosphere of a mixture of a plurality of source gases is formed over the substrate. The substrate and the plurality of source gases are alternatingly illuminated with each of a plurality of reaction lights having different wavelengths for a predetermined time while heating and cooling the substrate at a predetermined temperature for a predetermined time.

The step of heating and cooling the substrate may alternatingly proceed with the step of illuminating the reaction lights. The step of heating and cooling the substrate may proceed when any one of the plurality of reaction lights is illuminated. Also, the substrate may be heated at an ordinary temperature depending on the characteristics of the source gases.

PCVD reactor is disclosed, in which a multi-layered thin film according to the present invention is formed using light energy. The PCVD includes a chamber having a support for placing at least a first substrate thereon, a gas supply system for supplying a plurality of source gases to the substrate in the chamber, and a light supply system mounted at one side of the chamber and selectively emitting one of a plurality of reaction lights having a specific wavelength on the substrate. The light supply system includes a light generator for generating the plurality of reaction lights and a light emitter connected to the light generator to select and emit any one of the plurality of reaction lights to the substrate.

Each of the plurality of source gases supplied from the gas supply system is excited and activated by one of the identified wavelengths and has a different deposition object.

The PCVD reactor further includes a gas sprayer for introducing source gases supplied from the gas supply system, which is installed at an upper portion of the chamber, to the surface of the substrate in a substantially vertical direction. The reaction lights emitted from the light supply system are substantially vertically emitted to the substrate in a substantially vertical direction. Thus, the space in the chamber can be efficiently used. The reaction lights emitted from the light supply system may be laser-type condensing lights. The light supply system includes a scanner so that the plurality of reaction lights horizontally scans the whole surface of the substrate in a horizontal direction. A shaft swivels the light supply system within a predetermined angle to scan the substrate.

The PCVD reactor further includes a gas sprayer installed at one side of the chamber and horizontally introducing the plurality of source gases to the surface of the substrate.

The light supply system may be disposed at an upper portion of the chamber to vertically emit the plurality of reaction lights to the surface of the substrate in a vertical direction.

The light supply system includes a plurality of lamps having different wavelengths. The light supply system further includes a light source controller for lighting and alternatingly irradiating only lamps for any one wavelength of the plurality of lamps for a predetermined time.

The support may further include a heater for heating the substrate. It is preferable that the heater is a lamp for rapid thermal process to rapidly heat and cool the substrate within a short time. Any one of the plurality of source gases is activated to deposition a predetermined layer if it is heated to above a predetermined temperature. The PCVD reactor further includes a vacuum apparatus for decompressing the pressure in the chamber to less than 1 atmosphere at one side of the chamber. Thus, a CVD process may be performed at a low pressure.

There is provided another embodiment of a PCVD reactor in which a multi-layered thin film according to another embodiment of the present invention is formed using light energy. The PCVD reactor includes a chamber having a support for placing at least one substrate thereon, a gas supply system for supplying at least two source gases into the chamber; and a light source supply mounted at one side of the chamber and having one light source for emitting reaction lights to the substrate.

The source gases have different deposition objects and similar light absorption rates to reaction lights having the same wavelengths. The gas supply system further includes a relay valve for alternatingly supplying the source gases.

The PCVD reactor further includes a vacuum apparatus for decompressing the pressure in the chamber to less than 1 atmosphere at one side of the chamber.

BRIEF DESCRIPTION OF THE DRAWINGS

The above objects and advantages of the present invention will become more apparent by describing in detail preferred embodiments thereof with reference to the attached drawings in which:

FIG. 3D is a table showing gases used to generate particular wavelengths for the PCVD;

DETAILED DESCRIPTION OF THE INVENTION

Hereinafter, embodiments of the present invention will be described in detail with reference to the attached drawings. However, the embodiments of the present invention can be modified into various other forms, and the scope of the present invention must not be interpreted as being restricted to the embodiments. The embodiments are provided to more completely explain the present invention to those skilled in the art.

Figure 1A:
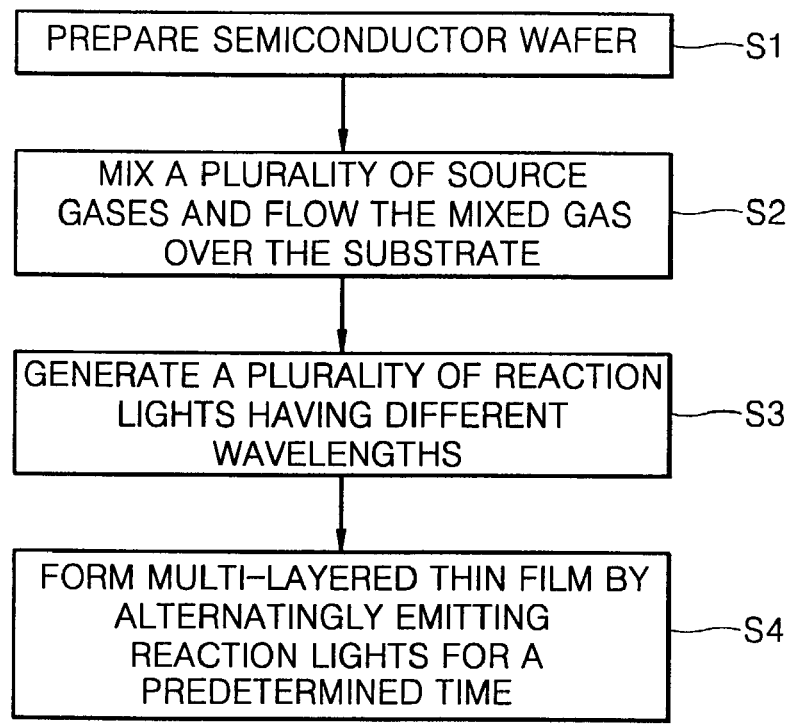
FIGS. 1A and 1B are flowcharts of steps of forming a multi-layered thin film using a PCVD method according to the present invention.
Figure 1B:
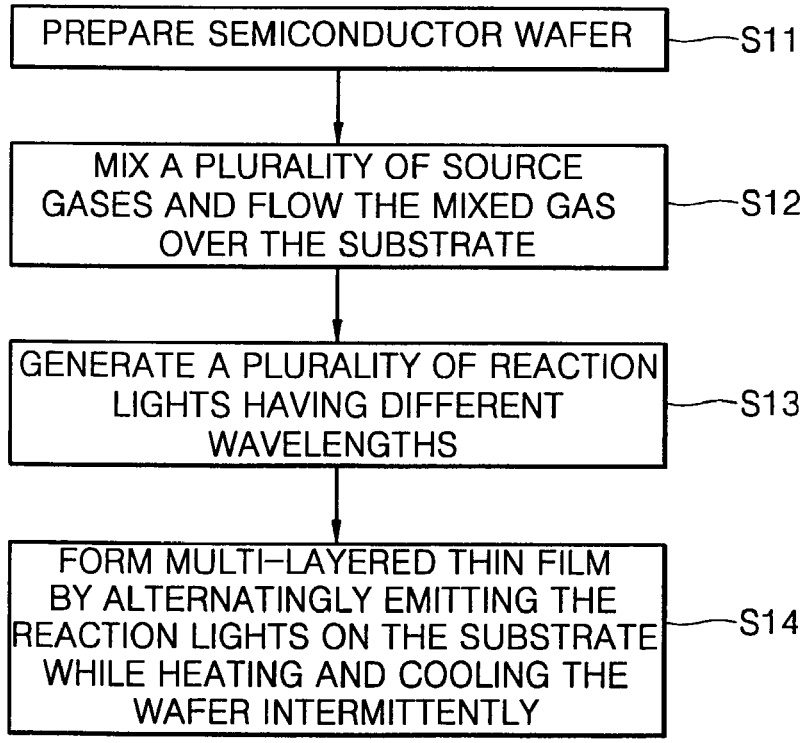

FIGS. 1A and 1B are flowcharts illustrating a method for forming a multi-layered thin film using a PCVD method according to an embodiment of the present invention. As shown in FIGS. 1A and 1B, a semiconductor substrate is provided (Process S1 or process S11). The semiconductor substrate may be, for example, a silicon wafer or a GaAs wafer. The substrate is placed in a reactor, and then two or more source gases for different deposition layers are mixed and flowed over the substrate (process S2 or process S12). Thus, a gas source gas mixture including the two or more source gases is provided onto the semiconductor substrate.

A plurality of reaction lights having different wavelengths are generated (process S3 or process S13). Each of the reaction lights can be easily absorbed by one of the source gases and excites that source gas. One of the reaction lights is selected and emitted on the substrate. Here, laser-type condensing lights may be used to scan the surface of the substrate with light emitted on the entire surface of the substrate in a horizontal direction. Alternatively, a blanket light may be used to scan the surface of the substrate with light emitted on the entire surface of the substrate in a vertical direction. The number of scans depends on the thickness of a deposition film.

After a first layer is formed and emitted lights are blocked, a second layer different from the first layer is formed on the surface of the first layer by emitting one of the other reaction lights on the surface of the substrate. A multi-layered thin film is formed of a desired material by alternatingly emitting reaction lights having different wavelengths a predetermined number of times (process S4).

In FIG. 1B, heating and cooling the substrate at a predetermined temperature can be further included in the process for emitting the reaction lights having different wavelengths. A first source gas, which selectively absorbs a particular wavelength, and a second source gas that generates a heat deposition reaction may be both used or may be used separately. In other wards, multi-layered thin film may be formed by heating and cooling the substrate intermittently while emitting a predetermined reaction light on the substrate (process S14). It is preferable that the atmosphere is in a vacuum state during a deposition reaction. The vacuum state is at a pressure of 1 atmosphere or less, i.e., within a range of 0.001–760 Torr.

A source gas may be supplied from a horizontal or vertical direction from a gas supply system to the substrate in a reactor. However, it is suitable for the configuration of a PCVD reactor that the source gas is supplied from a vertical direction to the substrate when using a laser-type condensing light and is supplied from a horizontal direction to the substrate when using a blanket light.

In the present method, the plurality of source gases have different deposition objects. At least one of the layers of the multi-layered thin film is deposited by a thermal reaction. Each of the plurality of reaction lights having different wavelengths is absorbed by at least one of the plurality of source gases to excite the state of that source gas. In that excited state, the source gas reacts to form a layer of the multi-layered thin film. Other source gases do not react with the particular emitted reaction light to form other layers of the multi-layered thin film. For emission of a given reaction light, therefore, at least one reaction gas reacts and deposits a layer via a thermal reaction, while the other source gases do not react with that reaction light and do not form a layer of the multi-layered thin film.

Figure 2:
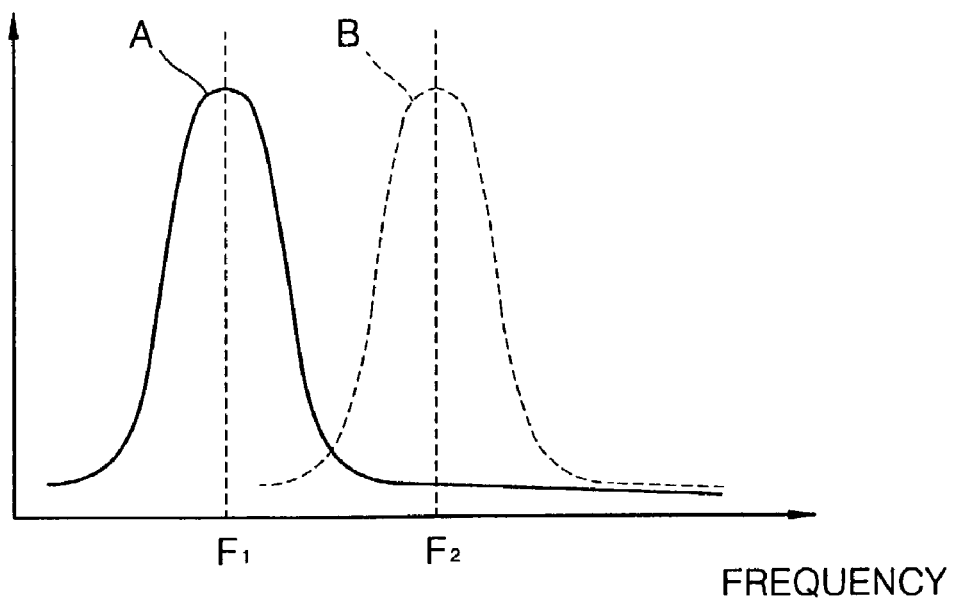
FIG. 2 is a graph of light absorption rates of source gases depending on wavelengths to describe a deposition reaction due to light absorption in detail and a reaction step from light absorption to deposition.

FIG. 2 shows a graph of light absorption rates of source gases depending on wavelengths to describe a deposition reaction due to light absorption in detail and a reaction step from light absorption to deposition. As shown in FIG. 2, source gas A has its highest light absorption rate at frequency F1. Source gas B has its highest absorption rate at frequency F2. Thus, source gases A and B have different optimal light absorption wavelengths.

In the formula shown below the graph, source gas A is represented as AX to depict that the source gas AX contains a deposition substance A. Source gas AX absorbs a reaction light having a frequency F1 and is changed to its excited state of AX*. Deposition compound A, contained in source gas AX, is dissociated into a gaseous state, thereby depositing pure source material A on the substrate. However, source gas B (represented as BY) effectively does not absorb the reaction light having frequency F1, and thus a deposition reaction essentially does not occur for deposition compound B when reaction light of frequency F1 is used.

Source gas BY absorbs a reaction light having a frequency F2 and is transformed into BY*, which is in an excited state. Thus, B is deposited on the substrate; source gas AX is not excited by a reaction light having frequency F2, such that A is essentially not deposited. As a result, only the source gas B is deposited on the substrate at this time.

Here, source gases A and B may be alkyl-based $M(CH_3)_x$, carbonyl-based $M(CO)_x$, halogenide-based $TiCl_4$, or acetylacetonate-based gases. As used herein, M is the objective material of a source gas, i.e., a material absorbing a reaction light and being deposited on the substrate. The source gas A or B may be Al, In, Ga, Mo, Cr, W, Ti, Au, Cu, or Pt.

Source gases having different light absorption rates are each photo-dissociated to react with elements of the substrate on the wafer. The source gases are in an excited state due to light absorption at a particular wavelength. Thus, a deposition object is deposited on the substrate.

Figure 3A:
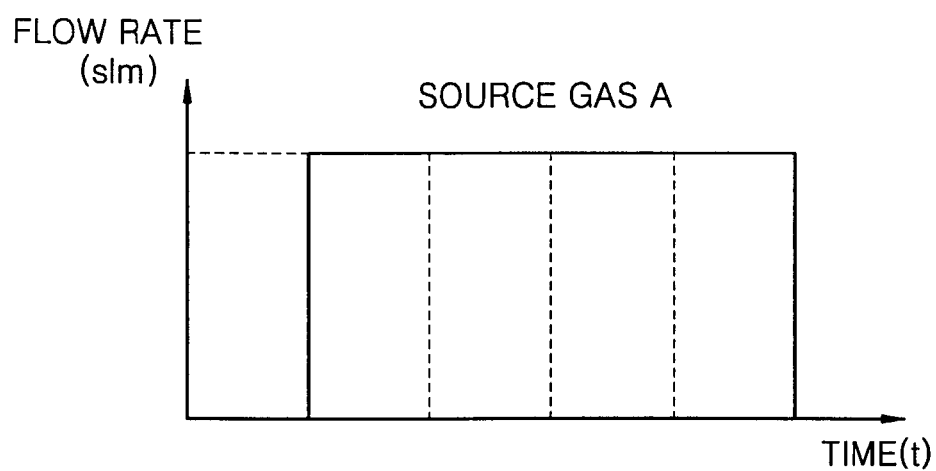
FIGS. 3A and 3B are graphs showing the correlation between source gases, a plurality of reaction lights, and deposited layers to explain a method of forming a multi-layered thin film by a PCVD method.
Figure 3A:
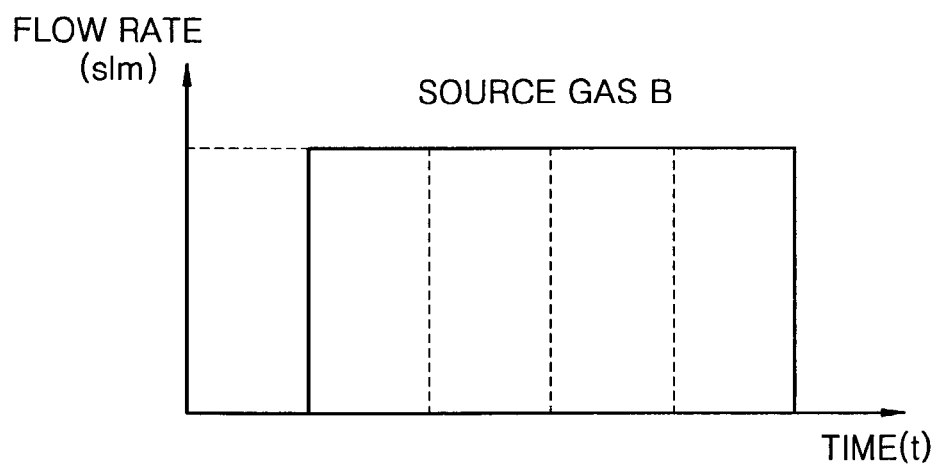
Figure 3B:
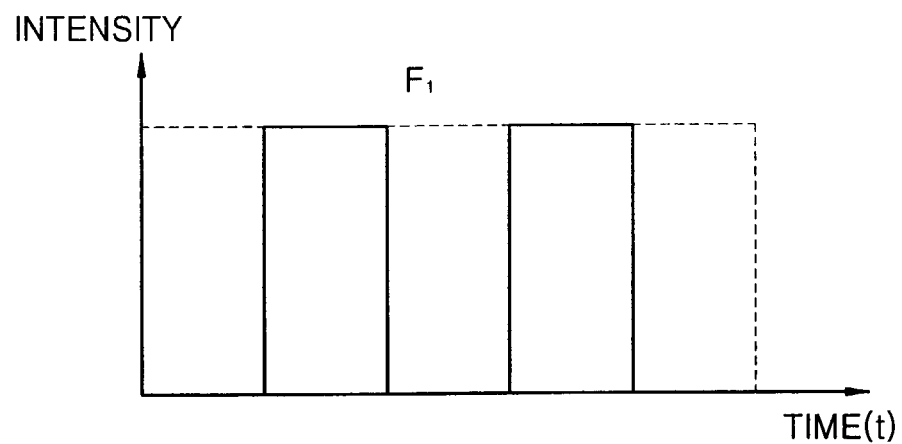
Figure 3B:
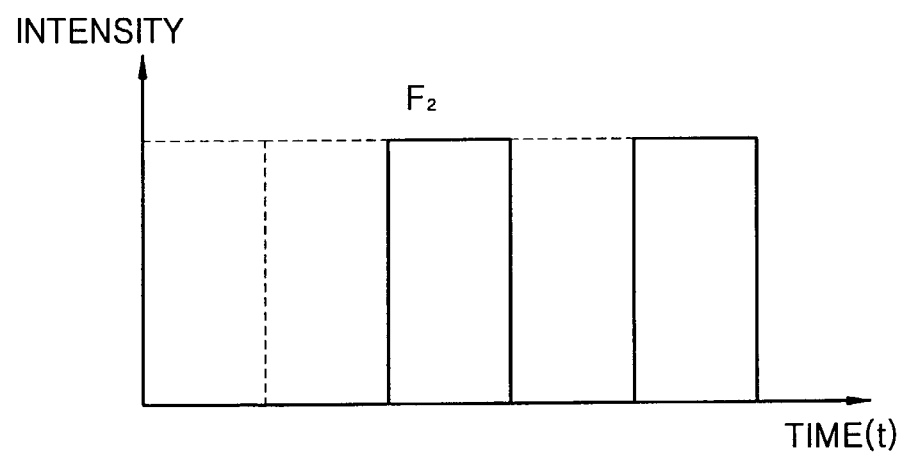
Figure 3C:
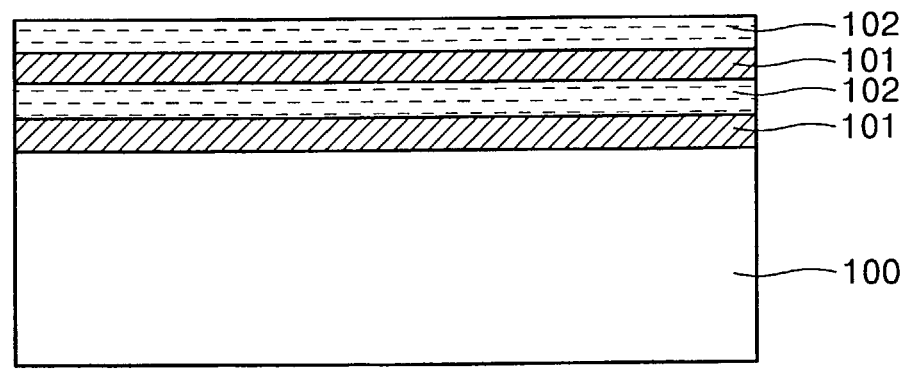
FIG. 3C is a cross-sectional view showing steps of forming a multi-layered thin film.

FIGS. 3A and 3B are graphs showing the correlation between source gases, a plurality of reaction lights, and deposited layers to explain a method of forming a multi-layered thin film by a PCVD method. FIG. 3C is a cross-sectional view showing steps of forming a multi-layered thin film.

As shown in FIG. 3A, an atmosphere comprising predetermined amounts of source gases A and B flows over a substrate. In FIG. 3B, two reaction lights, respectively having wavelengths F1 and F2, are alternatingly emitted at predetermined intervals. In other words, the reaction light F1 is emitted at the first interval, but the reaction light F2 is not emitted. Likewise, the reaction light F2 is emitted at the second interval, but the reaction light F1 is not emitted.

The source gas A reacts to the reaction light F1 on a first layer 101, thereby forming a layer A (FIG. 3C). The source gas B reacts to the reaction light F2 on a second layer 102, thereby forming a layer B. The repetition of this process results in forming a multi-layered thin film of alternating layers A and B. As described, two source gases are simultaneously supplied to a substrate, and two reaction lights each having different wavelengths are emitted in an appropriate order, thereby easily forming various types of multi-layered thin films.

Also, a plurality of layers having different compositions may be easily formed if appropriate source gases and reaction lights corresponding to the appropriate source gases are used.

FIG. 3D is a table showing gases used to generate particular wavelengths for the PCVD. As shown in the table, ArF, KrF, and XeCl are gases which generate reaction lights having relatively short wavelengths and can be used in a photo-stepper for photolithography. Argon ions ($Ar^+$) or $CO_2$ may be used to generate various wavelengths. In other words, a light source can generate reaction lights having various wavelengths required in a deposition process by supplying a predetermined gas into a lamp.

As described above, according to the present invention, a multi-layered thin film having different compositions can be easily formed on a substrate if a plurality of reaction lights having particular wavelengths are alternatingly emitted on the substrate for a predetermined time with supplying a plurality of source gases on the substrate.

As another example of a method of forming a multi-layered thin film that improves deposition efficiency, the multi-layered thin film can be formed if a gas supply system having a relay valve for supplying a plurality of source gases one at a time, which have different deposition objects and similar light absorption rates, for a predetermined amount of time, and a light supply system for emitting a reaction light having one particular wavelength are used. For example, a layer A is formed on a substrate if source gas A among source gases A and B having similar light absorption rates is first selected and supplied to the substrate and if a reaction light having a particular wavelength is emitted on the substrate. Next, a layer B is formed on the substrate if the supply of source gas A stops and the supply of source gas B begins and if the reaction light having a particular wavelength is emitted on the substrate. A multi-layered thin film having a desired characteristic can be formed if this process is repeated a predetermined number of times. As described above, a multi-layered thin film can be formed by alternatingly supplying only source gases using a single reaction light if source gases having similar light absorption rates are applied.

Figure 8:
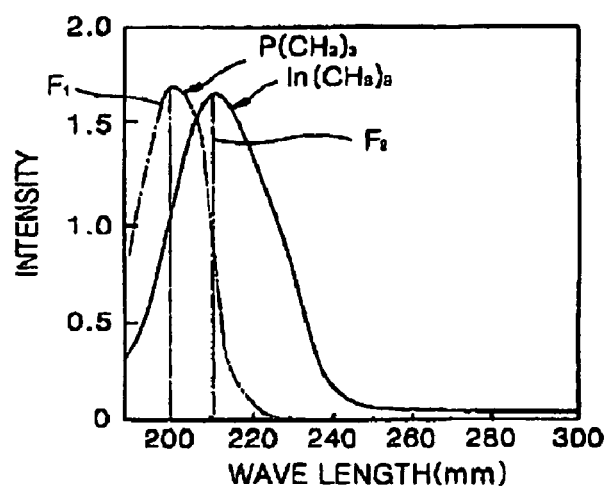
FIG. 8 is a graph showing light absorption rates of source gases used in a method of forming a multi-layered thin film according to the present invention and a cross-sectional view of the multi-layered thin film.
Figure 8:
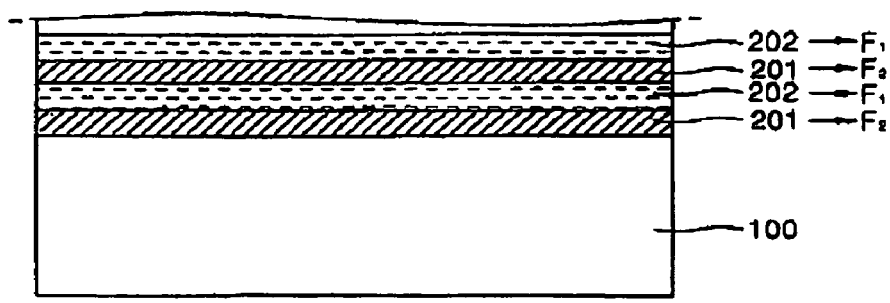

FIG. 8 is a graph showing light absorption rates for source gases $In(CH_3)_3$ and $P(CH_3)_3$ used for forming a multi-layered thin film by a PCVD method according to the present invention and a cross-sectional view of the multi-layered thin film. As shown in FIG. 8, a first source gas $In(CH_3)_3$ shows peak light absorption rate at 211 nm (broken line $F_2$) and a second source gas $P(CH_3)_3$ shows peak light absorption rate at 202 nm (broken line $F_1$). In other words, two source gases show different light absorption rates for a particular wavelength. Here, an InP layer, which is widely used for a high-speed device that is manufactured on a GaAs substrate, is generally formed of a compound of two elements In and P as a single layer. However, according to a recent experimental result, a multi-layered thin film formed of the combination of an In layer and an InP layer is effective in improving the characteristics of a device. In order to form the multi-layered thin film of the combination of the In layer and the InP layer, a mixture of source gases $In(CH_3)_3$ and $P(CH_3)_3$ is supplied to the substrate 5 while maintaining the inside of the chamber 1 at a pressure of several tens of Torr. Next, the multi-layered thin film is easily formed of the combination of the In layer and the InP layer if a reaction light having a wavelength of 200 nm and a reaction light having a wavelength of 230 nm are alternatingly emitted on the substrate 5. In other words, if the reaction light having a wavelength of 230 nm is emitted, $In(CH_3)_3$ absorbs and is excited by the reaction light, thereby forming an In layer 201 on the substrate 100. Next, if the reaction light having a wavelength of 200 nm is emitted, both $In(CH_3)_3$ and $P(CH_3)_3$ absorb the reaction light, and then both In and P are deposited on the substrate, thereby forming the InP layer 202. Thus, a multi-layered thin film basically including In and InP is formed by alternately emitting these reaction lights.

The method of forming a multi-layered thin film by the PCVD method according to the present invention also can be applied to memory devices manufactured on silicon substrates. A capacitor, which is an important component of a memory device, preferably uses a high dielectric film, such as BST $((Ba, Sr)TiO_x)$ and PLZT $((Pb, La) (Zr, Ti)O_3)$, interposed between two electrodes in order to increase the capacitance thereof. It is complicated and difficult to form this high dielectric film, which is a multi-layered compound made of the combination of a plurality of elements, by an existing method. However, it is simple to form this dielectric film by the PCVD method according to the present invention.

For BST, organic source gases containing Ba, Sr, and Ti and a source gas containing oxygen O are simultaneously supplied to a substrate. A Ba layer is formed by emitting a reaction light having a wavelength activating a Ba source gas over the substrate for a predetermined time. Next, a Ba oxide layer is formed by emitting a reaction light having a wavelength activating an oxygen source gas over the substrate for a predetermined time. A Sr layer is formed by emitting a reaction light having a wavelength activating a Sr source gas over the substrate for a predetermined time and then a Sr oxide layer is formed by emitting a reaction light having a wavelength activating an oxygen source gas over the substrate for a predetermined time. A Ti layer is formed by emitting a reaction light having a wavelength activating a Ti source gas for a predetermined time and then a Ti oxide layer is formed by emitting a reaction light having a wavelength activating an oxygen source gas for a predetermined time. Here, the order of forming the above layers may vary depending on the order of emitting reaction lights, and the composition of the layers may be easily adjusted by adjusting the time and the reaction lights are emitted to form the layers. Thus, a high dielectric BST layer is easily formed by sequentially emitting a plurality of reaction lights having different wavelengths in a reactor.

In the method of forming a multi-layered thin film by a PCVD method, a multi-layered thin film is formed by simultaneously supplying a plurality of source gases to a substrate and alternatingly emitting reaction lights having different wavelengths. Thus, there are advantages in that a process of forming the multi-layered thin film is simple and the frequency of operating a gas valve for supplying source gases is remarkably reduced. Also, the thickness of the multi-layered thin film is adjusted by adjusting the time for emitting reaction lights. Thus, since it is easier to adjust the thickness and uniformity of the multi-layered thin film, compared to an existing method of adjusting the thickness of the multi-layered thin film, by adjusting the supply of source gases, it is convenient to manage the process of forming the multi-layered thin film.

The method of forming a multi-layered thin film according to the present invention may be applied to a process of forming an electrode barrier layer such as a Pt layer, a RbO layer, and an Au layer, after a nitride layer, such as a TiN layer and a WN layer, which is used as a barrier layer of a metal wire, is formed, or a high dielectric material is deposited on a capacitor. In particular, in a case where a TiN barrier layer is formed, a source gas thereof is deposited by a heat reaction as well as a light reaction. Thus, a deposition rate can be increased if the temperature of a substrate is increased by a predetermined temperature. Also, if a multi-layered thin film is formed by combining the TiN barrier layer with another barrier layer, the source gas of the TiN barrier layer does not generate a light reaction, and a source gas of another barrier layer emits a reaction light having a wavelength generating a light reaction and repeatingly raising and dropping the temperature of the substrate. As a result, a multi-layered thin film is formed.

The method of forming a multi-layered thin film by a PCVD method according to the present invention has the several advantages over conventional methods. A mixture of a plurality of source gases is supplied to a substrate, and a plurality of reaction lights having different wavelengths are selectively emitted, thereby easily forming a multi-layered thin film on the substrate.

Further, a multi-layered thin film can be formed by selecting and emitting reaction lights of a plurality of reaction lights. Thus, the composition and thickness of the multi-layered thin film is easily adjusted. As a result, the present process provides flexibility in forming a multi-layered thin film.

Because a plurality of source gases are simultaneously supplied on the substrate, it is unnecessary to frequently open and close one or more gas valves. Thus, the life of a deposition apparatus can be prolonged.

A photolysis chemical vapor deposition reactor of the present invention includes a light supply system having a plurality of different wavelengths emitted on a substrate in a chamber. Thus, a multi-layered thin film is easily formed by emitting different wavelengths on the substrate.

A heating apparatus for heating the substrate is included to activate source gases using heat as well as reaction lights. Thus, a multi-layered thin film, which usually is difficult to form via depositor, is now easily formed.

Figure 4:
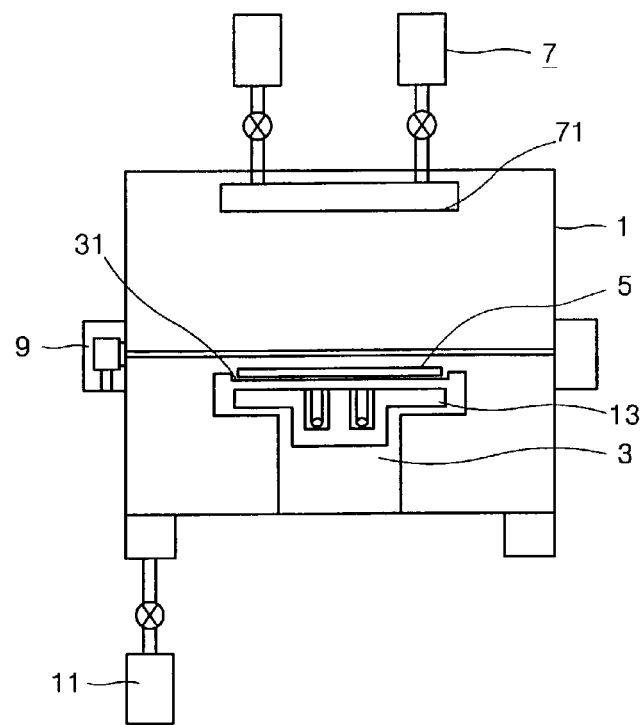
FIG. 4 is a cross-sectional view of a PCVD reactor according to an embodiment of the present invention.

A PVCD reactor according to the present invention is shown in the cross-sectional schematic diagram of FIG. 4. The PCVD reactor includes a chamber 1 having a substrate support 3 on which a substrate 5 can be placed, gas supplies 7 which are installed at the upper portion of the chamber 1 and supplies source gases to the substrate 5, a light supply system 9 that is installed at a side of the chamber 1 and adapted to generate reaction lights to activate the source gases and emitting the reaction lights on the substrate 5, and a vacuum apparatus 11 operative to maintain the inner portion of the chamber 1 at a low pressure. Here, one of a rotary pump, an ion diffusion pump, a cryogenic pump, and the like is properly installed as the vacuum apparatus 11 in consideration of the characteristics of a process. In general, a vacuum apparatus 11 may be selected to maintain the inner portion of the chamber 1 at a pressure of 0.01–700 Torr.

A gas sprayer 71 is provided for spraying source gases to the substrate 5 in the chamber 1. The gas sprayer is formed at the end of the gas supply system 7 which is connected to a plurality of source gases and the chamber 1. The gas sprayer 71 has a plurality of holes to diffuse the source gases to the substrate 5 from a vertical direction.

An upper portion of the support 3 includes a substrate supporting portion 31 that is recessed a predetermined amount so that the substrate 5 is placed horizontally on the substrate supporting portion 31. A heater 13, adapted to heat the substrate 5, is installed in a region underneath the substrate 5. The heater 13 is preferably a lamp-type heater used for a rapid thermal processor (RTP) so as to heat the substrate 5 rapidly in a short time. Here, the lamp-type heater 13 is installed in the support 3, but it may be installed at an upper portion of the chamber 1 so that the lamp-type heater 13 is spaced apart from the support 3 so as to not affect the light supply system 9. The support 3 preferably comprises a material having high heat conductivity, e.g., metal, silicon carbide, or quartz, in order to easily absorb and rapidly cool heat from the substrate 5.

The light supply system 9 includes a plurality of light generators 9a and 9b (shown in FIG. 5A) configured to generate and emit a plurality of reaction lights having different wavelengths, and a light emitter (not shown) for selecting and emitting any one of the reaction lights of the light generators 9a and 9b. The light generators 9a and 9b may generate reaction lights having several wavelengths, but in this embodiment of the present invention they generate condensing lights of a laser.

Figure 5A:
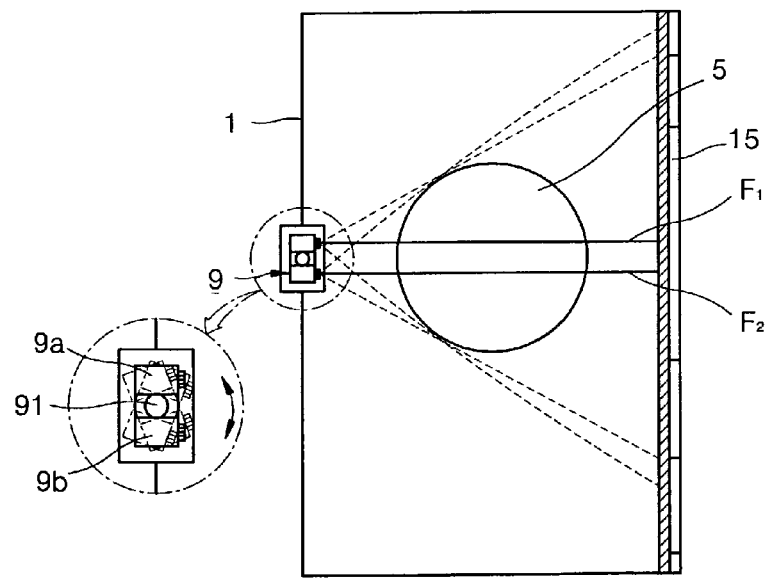
FIGS. 5A and 5B are bottom views of light source supplies shown in FIG. 4.

FIG. 5A is an enlarged bottom view of the light supply system shown in FIG. 4. As shown in FIG. 5A, the plurality of light generators 9a and 9b are disposed in the light supply system 9 so that reaction lights are emitted on the surface of the substrate 5 from a horizontal direction. The light generators 9a and 9b, which generate reaction lights having different wavelengths, are adjacent and parallel to each other. A shaft 91 is installed at the center of gravity of the light supply system 9 so that the light supply system 9 itself swivels. As marked with dotted lines, fan-shaped beams of the reaction lights scan the substrate 5. Here, a shielder 15, structured to shield the reaction lights, is installed on the sidewall of the chamber 1 on an opposite side from where the reaction lights are emitted.

Figure 5B:
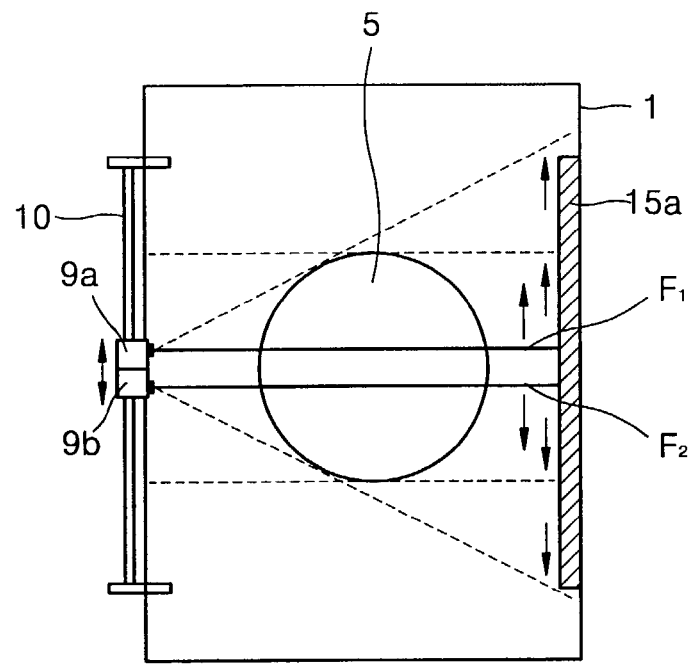

FIG. 5B is a schematic diagram of another embodiment of a light supply system. As shown in FIG. 5B, the light supply system of FIG. 5B is the same as the light supply system of FIG. 5A in the way that emitting reaction lights are parallel to the substrate 5. However, the light supply system of FIG. 5B further includes a scanner 10 structured to move the light supply system 9 along a straight line-shaped taxiway. In other words, the reaction lights can be emitted onto the substrate 5 to scan the entire surface of the substrate 5 by moving the light supply system 9 in a straight line and parallel to the surface of the substrate 5 by the scanner 10 in directions indicated by the arrows. As a result, the area of a shielder 15a facing the reaction lights varies. In other words, in the rotary scanning method of FIG. 5A, the length of the fan-shaped beams of the reaction lights at the side of the chamber 1 opposite to the light supply system 9 must be shielded. However, in the straight-line movable scanning method, the distance the light supply system 9 moves in a straight-line must be shielded, and thus a shielded region is relatively narrow.

Figure 6:
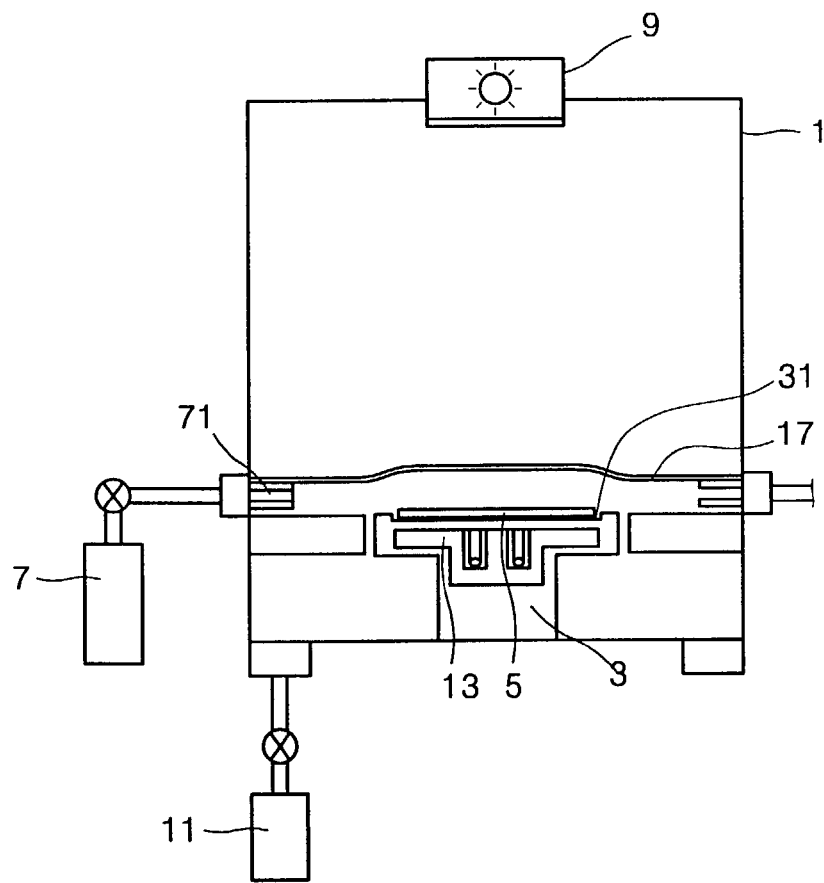
FIG. 6 is a cross-sectional view of a PCVD reactor according to another embodiment of the present invention.

FIG. 6 shows another embodiment of a PCVD reactor according to the present invention. As shown in FIG. 6, the PCVD reactor includes a chamber 1 having a support 3 where a substrate 5 is placed, a light supply system 9 which is installed at an upper portion of the chamber 1 and adapted to emit reaction lights on the substrate 5, a gas supply system 7 and adapted to supply a plurality of source gases to the substrate 5 in the chamber 1, and a vacuum apparatus 11 which is connected to the chamber 1 and can maintain the pressure in the chamber 1 at a low pressure of less than 1 atmosphere. Here, only differences between the PCVD reactor of FIG. 4 and the PCVD reactor of FIG. 6 are described as follows.

The light supply system 9 is installed at the upper portion of the chamber 1 so that reaction lights are emitted on the surface of the substrate 5 from a vertical direction. Here, condensing lights are not used as the reaction lights; instead, light sources are used which can be uniformly emitted on the whole surface of the substrate.

Since the gas sprayer 71 is installed at a side of the chamber 1, the gas supply system 7 is disposed so that gases can be diffused in a direction horizontal to the surface of the substrate 5. The gas sprayer 71 has a nozzle which is open toward a diffusing direction.

The chamber 1 further includes an upper cover 17, which divides the inner region of the chamber 1 into an upper portion and a lower portion and is spaced apart from the substrate 5 so that streams of source gases in the chamber 1 are uniformly induced.

Figure 7A:
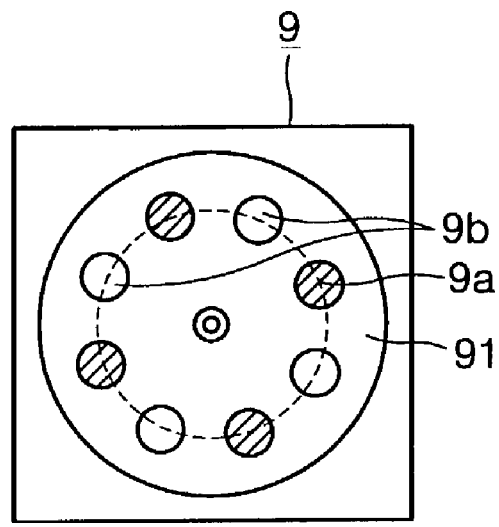
FIGS. 7A and 7B are bottom views of light source supplies shown in FIG. 6.

FIG. 7A is a bottom view of an embodiment of the structure of the light supply system 9 of FIG. 6. As shown in FIG. 7A, different reaction lights having different wavelengths can be emitted. A series of light generators 9a and 9b, which are mounted on a bottom surface of the light supply system 9 and can generate reaction lights, are disposed in a circle. Here, light generators 9a and 9b, which generate reaction lights having different wavelengths, are adjacently and alternatingly disposed. A light generator 9a or 9b having a particular wavelength is structured to be lit only if it is desired that the reaction light is so emitted onto the whole surface of the substrate 5. Thus, a series of light generators 9a or 9b having different wavelengths can alternatingly be turned on and off so that reaction lights having different wavelengths are alternatingly emitted.

Figure 7B:
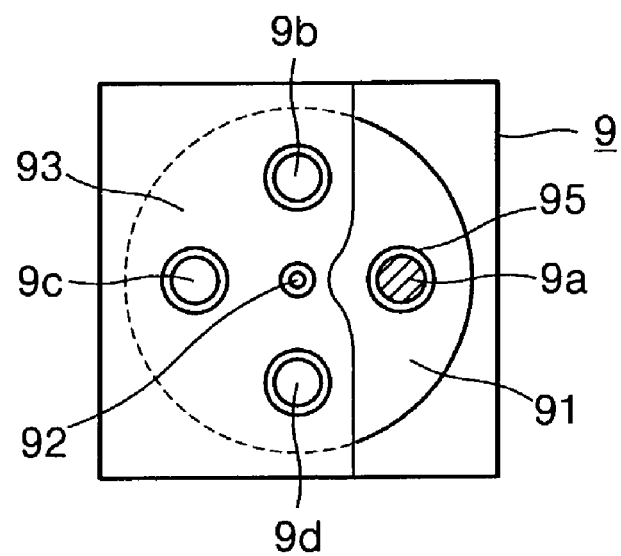

FIG. 7B is a bottom view of another embodiment of the light supply system of FIG. 6. As shown in FIG. 7B, a circular operator 93, which is rotated by a rotating shaft 92 installed at the center, is installed at the lower surface of the light supply system 9. A plurality of light generators 9a through 9d are circularly disposed on the circular operator 93. An opening 95 is formed at one side region of the lower surface of the light supply system 9 so that reaction lights are emitted through one light generator. The light generators 9a through 9d may generate reaction lights having different wavelengths, and an operating plate 91 may rotate such that a light generator having a desired wavelength is set at the opening 95, thereby emitting a reaction light having a particular wavelength on the substrate 5. The light supply system 9 may further include at least one lens to properly concentrate or diffuse the reaction lights.

A person skilled in the art will be able to practice the present invention in view of the description present in this document, which is to be taken as a whole. In some instances, well-known features have not been described in detail in order not to obscure unnecessarily the invention. While the invention has been disclosed in its preferred form, it should be readily apparent to those skilled in the art in view of the present description that the invention can be modified in numerous ways. The inventor regards the subject matter of the invention to include all combinations and sub-combinations of the various elements, features, functions and/or properties disclosed herein.

The invention claimed is:

1. A method for forming a multi-layered thin film comprising:
   forming an atmosphere comprising a plurality of source gases over a substrate; and
   sequentially illuminating the substrate and the plurality of source gases with each of a plurality of reaction lights, each of the plurality of reaction lights having a wavelength different from the rest of the reaction lights, each of the plurality of source gases reactive to only one of the plurality of reaction lights.

2. The method of claim 1, further comprising generating the plurality of reaction lights between forming the atmosphere and sequentially illuminating the substrate and source gases.

3. The method of claim 1, wherein the plurality of source gases have different deposition objects.

4. The method of claim 3, wherein each of the plurality of source gases have different light absorption wavelength ranges.

5. The method of claim 1, wherein each of the plurality of source gases can be excited by a selected reaction light of the plurality of reaction lights.

6. The method of claim 5, wherein a source gas reacts during the sequential illumination with one of the plurality of reaction lights to form one layer of the multi-layered thin film.

7. The method of claim 6, wherein other source gases except for source gases involved in the reaction do not react to form the any one layer of the multi-layered thin film.

8. The method of claim 1, wherein a light source of the plurality of reaction lights is a laser-type condensing light.

9. The method of claim 8, wherein the plurality of reaction lights move in a parallel direction with respect to the surface of the substrate to scan the whole surface of the substrate.

10. The method of claim 1, further comprising forming an atmosphere having low pressure of 0.1–700 Torr before forming the atmosphere of a mixture of source gases.

11. A method for forming a multi-layered thin film, comprising:
    preparing a substrate;
    forming an atmosphere comprising a plurality of source gases over the substrate;
    alternately emitting for a predetermined time each of a plurality of reaction lights on the substrate and the plurality of source gases, each of the plurality of reaction lights having a wavelength different from the rest of the reaction lights, each of the plurality of source gases reactive to only one reaction light; and
    alternately heating and cooling for a predetermined time the substrate at a predetermined temperature.

12. The method of claim 11, wherein heating and cooling the substrate alternately proceeds with alternately emitting the reaction light for the predetermined time.

13. The method of claim 11, wherein heating and cooling the substrate proceeds contemporaneous with emitting at least one of the plurality of reaction lights.

14. The method of claim 11, wherein the plurality of source gases have different deposition objects.

15. The method of claim 11, wherein at least one of the plurality of source gases is deposited by a thermal reaction.

16. The method of claim 11, wherein at least one source gas absorbs a reaction light of a selected wavelength and is excited by said reaction light of said selected wavelength.

17. The method of claim 16, wherein emitting a reaction light excites a predetermined source gas to form a predetermined layer of the multi-layered thin film.

18. The method of claim 17, wherein emitting a reaction light excites only a predetermined source gas to form only a predetermined layer of the multi-layered thin film.

19. The method of claim 11, further comprising forming an atmosphere having a pressure of 0.1–700 Torr before forming the atmosphere of a mixture of the plurality of source gases.

20. The method of claim 11, wherein the plurality of source gases comprise $P(CH_3)_3$ and $In(CH_3)_3$.

* * * * *